(12) United States Patent
Domanski et al.

(10) Patent No.: US 8,413,101 B2
(45) Date of Patent: Apr. 2, 2013

(54) SYSTEM AND METHOD FOR DETECTING PARASITIC THYRISTORS IN AN INTEGRATED CIRCUIT

(75) Inventors: Krzysztof Domanski, Munich (DE); Jens Schneider, Munich (DE); Angelika Jungmann, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/184,011

(22) Filed: Jul. 15, 2011

(65) Prior Publication Data

US 2013/0019222 A1 Jan. 17, 2013

(51) Int. Cl.
*G06F 11/22* (2006.01)
*G06F 17/50* (2006.01)

(52) U.S. Cl. ......... 716/136; 716/110; 716/103; 716/104
(58) Field of Classification Search ............... 716/50, 716/51, 52, 54, 55, 136
See application file for complete search history.

(56) References Cited

U.S. PATENT DOCUMENTS

| | | | |
|---|---|---|---|
| 5,255,146 A | 10/1993 | Miller | |
| 5,638,286 A * | 6/1997 | Fujimoto | ........................ 716/115 |
| 5,930,094 A | 7/1999 | Amerasekera et al. | |
| 6,078,083 A | 6/2000 | Amerasekera et al. | |
| 6,097,071 A | 8/2000 | Krakauer | |
| 6,140,682 A | 10/2000 | Liu et al. | |
| 6,268,993 B1 | 7/2001 | Anderson | |
| 6,310,379 B1 | 10/2001 | Andresen et al. | |
| 6,353,520 B1 | 3/2002 | Andresen et al. | |
| 6,356,427 B1 | 3/2002 | Anderson | |
| 6,369,998 B1 | 4/2002 | Anderson | |
| 6,510,033 B1 | 1/2003 | Maloney et al. | |
| 6,534,833 B1 | 3/2003 | Duvvury et al. | |
| 6,535,368 B2 | 3/2003 | Andresen et al. | |
| 6,633,468 B1 | 10/2003 | Duvvury et al. | |
| 6,657,264 B2 | 12/2003 | Cho et al. | |
| 6,724,603 B2 | 4/2004 | Miller et al. | |
| 7,401,311 B2 | 7/2008 | Voldman | |
| 7,474,011 B2 | 1/2009 | Lien et al. | |
| 7,549,135 B2 | 6/2009 | Chapman et al. | |
| 2006/0048080 A1* | 3/2006 | Watson et al. | ..................... 716/4 |
| 2006/0226488 A1 | 10/2006 | Schneider et al. | |
| 2011/0057230 A1* | 3/2011 | Udrea et al. | ................... 257/141 |

OTHER PUBLICATIONS

Kontos, D., et al., "Investigation of External Latchup Robustness of Dual and Triple Well Designs in 65nm Bulk CMOS Technology," IEEE 44th Annual International Reliability Physics Symposium, 2006, pp. 145-150.

* cited by examiner

*Primary Examiner* — Thuan Do
*Assistant Examiner* — Brian Ngo
(74) *Attorney, Agent, or Firm* — Slater & Matsil, L.L.P.

(57) ABSTRACT

In an embodiment, a method includes retrieving a layout of an integrated circuit design from a non-transitory computer readable medium, identifying a silicon controlled rectifier (SCR) structure in the layout, identifying a current injection site in the layout, and determining if a distance between the identified current injection site and the identified SCR structure is less than a first threshold. A violation is flagged if the determined distance is less than the first threshold.

22 Claims, 9 Drawing Sheets

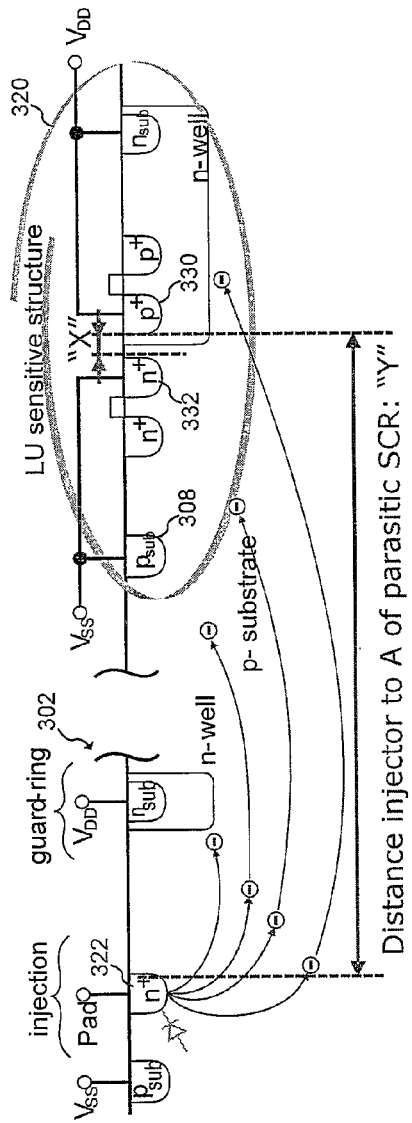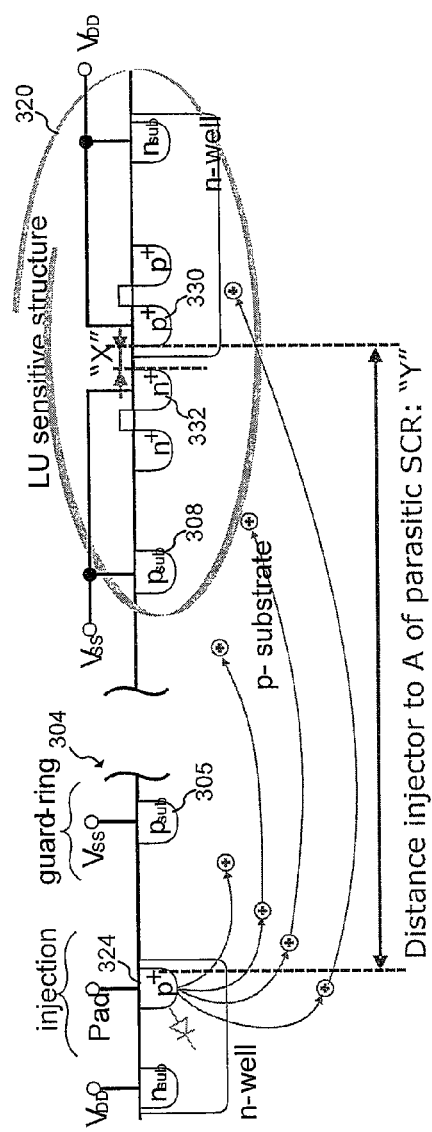
FIG. 3a
FIG. 3b

| Rule name: | Distance Y ( hot n_diff) | Distance Y (hot p_diff) |
|---|---|---|
| SCR with floating n-well | 200 | 200 |
| SCR with n-well hard @ VDD | 30 | 15 |

| Rule name: | Voltage of anode (V) | Voltage of cathode (V) | Nwell of anode | Minimal distance X between anode and cathode (μm) |
|---|---|---|---|---|
| LUparaGnd1 | 1,80 | 0 | Not at power | 40 |
| LUparaGnd2 | 1,80 | 0 | At power | 5 |
| LUparaPwr1 | 1,80 | 1,20 | Not at power | 5 |
| LUparaPwr2 | 1,80 | 1,20 | At power | 2,50 |

SYSTEM AND METHOD FOR DETECTING PARASITIC THYRISTORS IN AN INTEGRATED CIRCUIT

TECHNICAL FIELD

This invention relates generally to semiconductor circuits and methods, and more particularly to a system and method for detecting parasitic thyristors in an integrated circuit database.

BACKGROUND

In many integrated circuit (IC) technologies, NMOS and PMOS transistors have n+ and p+ implantations placed within n-wells or p-wells or on top of a bulk p-type substrate. Having an NMOS and a PMOS device in close proximity to each other, however, can potentially form a parasitic silicon controlled rectifier (SCR), also referred to as parasitic thyristor structure.

Under normal operating conditions, the parasitic SCR is in a high-ohmic state, because the parasitic SCR has a trigger or turn-on voltage that is higher than a normal operating voltage used in standard CMOS/bipolar applications. While in the high-ohmic state, the SCR has a high impedance, typically in the Mega-Ohm region. The residual current flowing between supply (VDD) and ground (VSS) connected to the terminals of the SCR structure is the leakage current of the reverse biased p-n junction. If, however, a large transient occurs on the power supply lines, ground lines or I/O lines that exceeds the turn-on voltage or current of the parasitic SCR, the SCR may trigger.

After the SCR is triggered, the resistance of the parasitic SCR structure between power supply and ground may change to a low ohmic path, typically in the range of one Ohm to several Ohms. This short circuit may cause the integrated circuit (IC) to malfunction as a consequence of voltage breakdown on the supply, or cause irreversible damage due to heat dissipation in the triggered thyristor. This phenomenon of the unintentional triggering is commonly referred to as latch-up.

Latch-up is an omnipresent risk in the modern complex integrated circuits (ICs). Contemporary ICs contain millions of transistors, placed in various blocks, such as analog blocks, IO cells, memory blocks, and logic blocks. These various blocks can have different functionalities, topologies, connectivity, supply voltages and physical structure. Due to enormously complex and diverse topology of the IC, there is a likelihood that a parasitic SCR will be unintentionally formed.

SUMMARY OF THE INVENTION

In an embodiment, a method includes retrieving a layout of an integrated circuit design from a non-transitory computer readable medium, identifying a silicon controlled rectifier (SCR) structure in the layout, identifying a current injection site in the layout, and determining if a distance between the identified current injection site and the identified SCR structure is less than a first threshold. A violation is flagged if the determined distance is less than the first threshold.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a-b illustrate cross sections of parasitic SCR structures that are detectable using embodiment systems and methods;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system and method for detecting parasitic SCRs or thyristors in integrated circuit layouts. The invention may also be applied, however, to detecting other types of parasitic structures such as parasitic NPN and parasitic PNP bipolar transistors.

In an embodiment, systems and methods identify parasitic SCRs by identifying potential SCR structures, potential injection pads, and measuring the distance between them. If the distance between the potential SCR structure and the potential injection pad is less than a threshold, the potential SCR structure is flagged. In some embodiments, this threshold distance between the potential SCR structure and the potential injection pad varies according to the structure of the injection pad and the SCR structure. For example, if the SCR structure has an anode disposed in a floating well, the SCR structure is more susceptible to triggering. Therefore, in some embodiments, the threshold distance for flagging is greater than for the case where the anode is disposed in a well that is tied, for example, to VDD. In other embodiments, other factors can determine the distance between the potential SCR structure and the potential injection pad as well.

In some embodiments, identification of the potential SCR structure itself involves identifying potential anode and cathode areas that lie within a threshold distance from each other. Again, this threshold distance for potential anode and cathode areas may be dependent on other factors such as device structure and node connectivity. In some embodiments, the methods described herein can be executed by a processor or by a computer during the design phase of an integrated circuit design.

Due to enormous complexity of the modern ICs, there is plurality of devices that can be involved in a parasitic SCR structure. Depending on its topology, the parasitic SCR can have varying sensitivities to latch-up, which can be triggered due to direct injection of the current (internal latch-up) or injection via substrate (external latch-up).

Figure 1A:
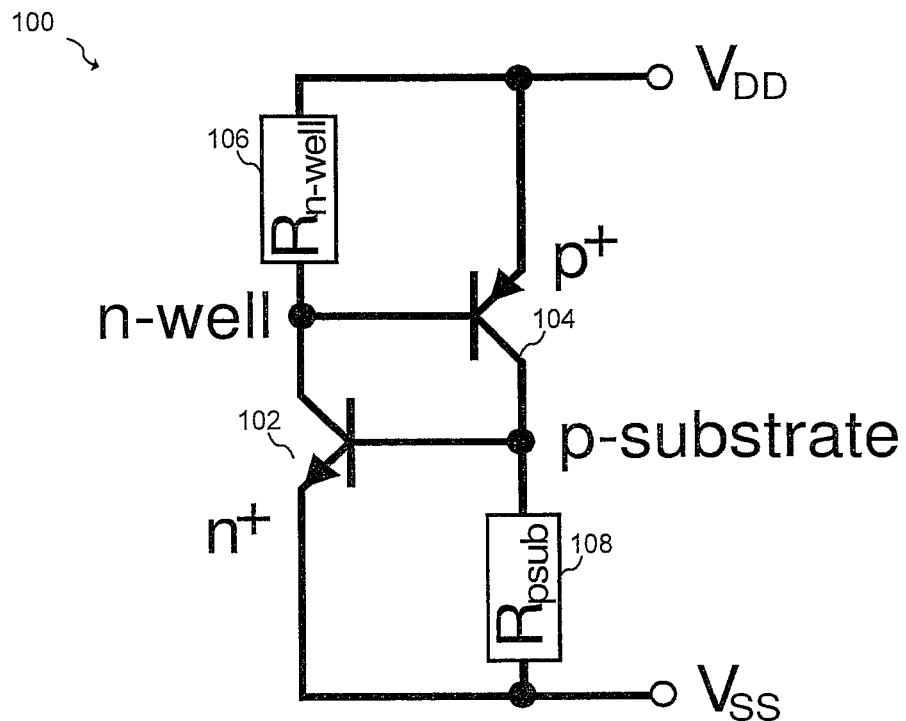
FIGS. 1a-b illustrate a circuit diagram and a cross section of a parasitic SRC device.

Internal latch-up describes the sensitivity of parasitic SCRs formed by neighboring p and n doped regions to triggering under direct injection at the current to the terminals of the SCR. This kind of latch-up occurs most frequently in the I/O area, where the diffusions at pad inject the latch-up currents to bulk. Such pad diffusions can also become a part of the parasitic SCR. An equivalent circuit of a parasitic SCR 100 is illustrated in FIG. 1a that has two complementary parasitic bipolar transistors NPN 102 and PNP 104, which can be formed, for example, by NMOS and PMOS transistors present in a driver, inverter, logic gate, or other type of circuit. N-well resistance and p-substrate resistances are represented by resistors 106 and 108, respectively.

Figure 1B:
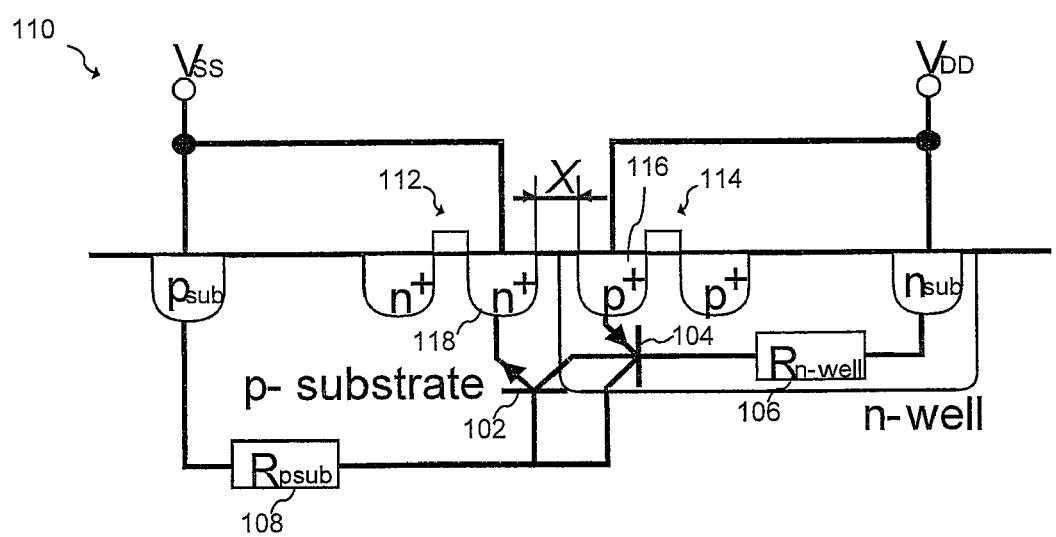

FIG. 1b illustrates a cross-section of CMOS inverter 110 having NMOS device 112, PMOS device 114, and the conceptual locations of parasitic NPN 102, PNP 104, n-well resistor 106 and p-well resistor 108. In this example, the anode of the SCR corresponds to p+ diffusion region 116 and the cathode of the SCR corresponds to n+ diffusion region 118. The distance between anode 116 and cathode 118 is denoted by distance X.

In order for latch-up to occur and to exhibit a self-sustaining latch-up current, a positive voltage difference that is higher than a holding voltage of the SCR is applied between the anode 116 and cathode 118 (i.e., a higher potential is applied to the anode 116.) This holding voltage of the SCR can be a function of the resistance between anode and cathode and bulk connection. The resistance between anode and cathode and bulk connection can be affected by distance and external resistance.

Figure 2:
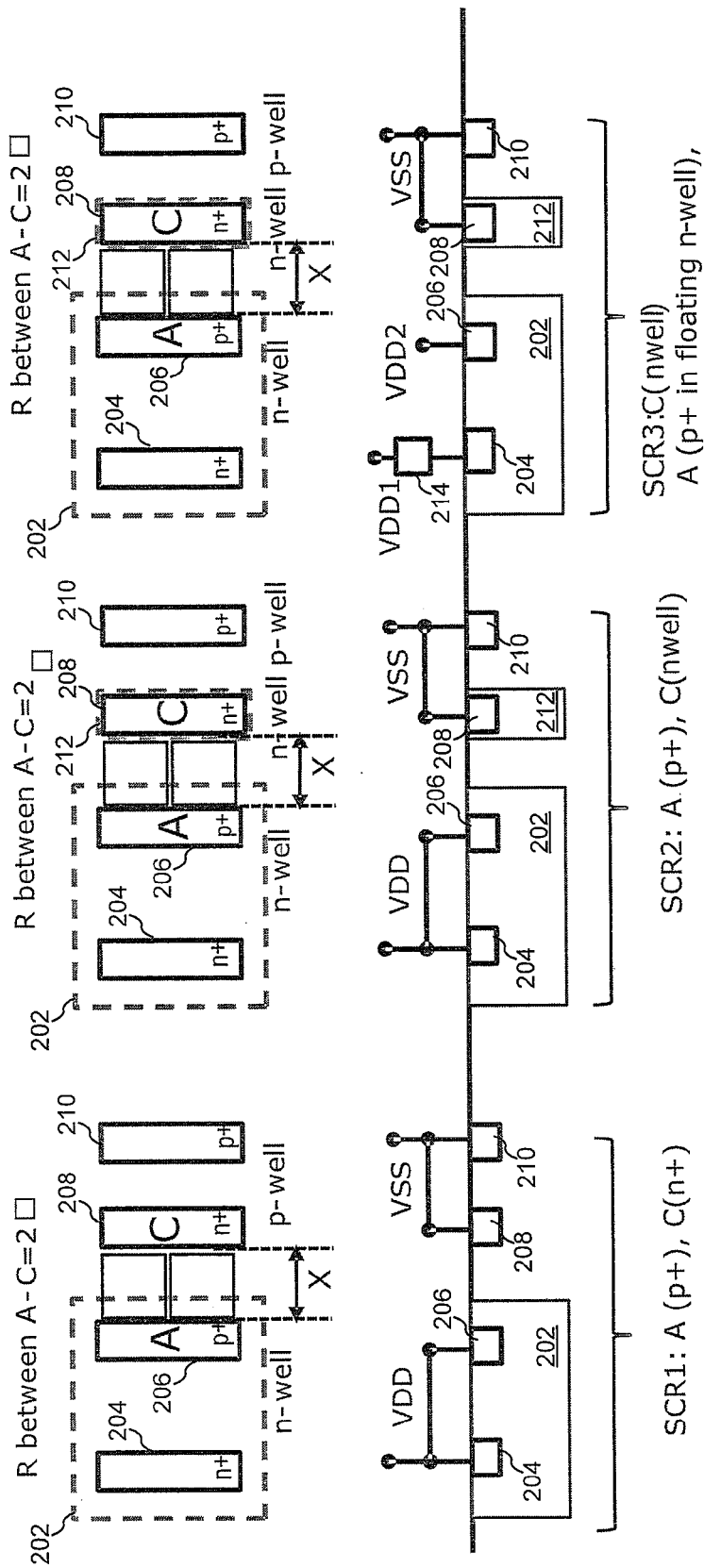
FIG. 2 illustrates layout and cross-sections parasitic SCR structures that are detectable using embodiment systems and methods.

FIG. 2 illustrates layout view and cross-section of parasitic SCRs formed by different diffusion regions and having different connections, such as those SCR devices that are detectable by embodiment systems and methods. In the illustrated examples, SCR1, SCR2 and SCR3 have a same distance X between anode diffusion region 206 and cathode diffusion region 208. Even though there are two squares of resistance between anode diffusion region 206 and cathode diffusion region 208, and similar diffusion and n-well areas, the holding voltages and sensitivities of SCR1, SCR2 and SCR3 to triggering current can differ. In embodiments, terminals forming parasitic structures can be a part of MOS, bipolar diode, capacitor or any other semiconductor device. In FIG. 2, only the diffusions involved in the SCR were shown for simplicity of illustration.

SCR 1 has p+ anode 206 in n-well 202, n+ cathode in a p-well, p+ p-well contact 210 and n+ n-well contact 204. As shown in the figure, anode 206 and n+ n-well contact 204 is coupled to VDD and cathode 208 and p+ p-well contact 210 is coupled to VSS. SCR2, on the other hand, has n+ cathode disposed in n-well 212. The topology of SCR3 is similar to the topology of SCR2 with the addition of extra resistance 214 in series with VDD1 and n+ n-well connection 202. In an embodiment, SCR3 is more sensitive to latch-up than SCR2, due to external series resistance 214 at the n-well connection 204. The latch-up current flowing through external resistor 214 creates an additional voltage drop and, thereby reducing the trigger current level.

In the case of external latch-up, the current that trigger the parasitic SCR is due to external injection, which is delivered, for example via the substrate by n+ or p+ terminals (hot diffusions) of devices directly connected to an external IC interface, such as a coupled to an I/O pin or other interface to the external world. In some embodiments, these devices can have comparably large n+ or p+ diffusion regions. Examples of such devices include ESD protection elements that shield core logic against electrostatic discharge or driver stages. Capacitors and diodes are further devices that often are connected directly to pins of an IC device.

FIGS. 3a and 3b illustrate a cross section of an arbitrary region of the IC containing a critical parasitic SCRs structure 320 and guard-ring 302. In FIG. 3a, hot n+ injection pad 322 injects minority carriers (electrons) in to the substrate, whereas in FIG. 3b, hot p+ injection pad 324 injects majority carriers (holes) in to the substrate. This injected substrate current triggers the parasitic SCR in the core placed within distance Y μm. The distance between anode 330 and cathode 332 of parasitic SCR 320 is X μm.

Generally, for the protection of core logic against the injected carriers, so-called guard rings 302 and 304 are applied, as shown in FIGS. 3a and 3b, respectively. These guard-rings, in some cases, are unable to collect all the substrate current that is injected deep into the bulk. According to some literature, the guard-ring efficiency reaches up to 95%. The remaining current is distributed among the plurality of parasitic structures formed by diffusions of neighboring devices that are placed within distance Y of anode 332 of SCR structure 320. These parasitic devices have trigger currents that may differ over several orders of magnitude. For example, in some types of parasitic SCRs having floating base of parasitic NPN or PNP, (see e.g. SCR3 in FIG. 2) even small portion of current in range of 1 μA may lead to latch-up. In the case of SCR1 illustrated in FIG. 2, the trigger current may be much larger, for example, in the range of 10 mA. In some embodiments, an IC may be protected from these multiple parasitics by decoupling them from each other, for example, by making holding voltage of the SCR higher than the supply voltage. In one embodiment, the holding voltage is increased, for example, by increasing of the distance X between anode 332 and cathode 330.

Furthermore, the current injected to the bulk can be either negative or positive. If a negative current (electrons) is injected from hot diffusion 322 to p-bulk substrate, for example, the electrons constitute the minority carriers in p-bulk and diffuse large distances, even several 100 μm to reach the SCR (FIG. 3a).

If a positive current (holes) is injected to the p-bulk substrate, the holes become the majority carriers in p-bulk (FIG. 3b). The holes flow ohmic in the bulk, drift to nearby placed substrate contacts 305 and 308, and are shunted to ground. Because the transport mechanism of holes is different from the transport mechanism of electrons, the distance Y, around which SCR devices are checked is smaller for p-diffusion injection pads than it is for n-diffusion injection pads. For example, in some embodiments, distance Y may be in the range of several 100 μm for n-diffusion pads (minority carriers), and in the range of several 10 μm for p-diffusion pads (majority carriers).

Further, in some special configurations even latch-up guard-ring 302 shown in FIG. 3a itself can become a part of parasitic SCR 320. In order to localize all the parasitic structures, embodiment methods distinguish the potentials at which the diffusions are attached, analyzes the distances X between the anode and cathode of the parasitic structure and additionally checks for the distance Y between different injection sources and the SCR.

A method and apparatus to assist in the development of a latch-up free chip design is proposed. The method comprises procedure of checking the layout for latch-up critical parasitics and flagging them. The selection of the parasitic devices, which are flagged and decoupled, may be conducted using several parameters.

In an embodiment, the parasitic SCR is only flagged if there is a source of current injection close enough to the anode or cathode of the SCR, or if the carriers are injected from the pad directly to anode or cathode of the SCR. In some embodiments, this is accomplished by checking configurations where the anode or the cathode is less than a distance Y to a hot-diffusion. Furthermore, the minimum distance Y from injector to the SCR may be made dependent on the topology of injecting diffusion. In some embodiments, distance Y is defined experimentally or by simulations. Embodiment parameters may be estimated using one or more of the following parameters: diffusion type of hot diffusion, magnitude of injected current, and topology of the injector. The diffusion type of the hot diffusion may be p-type or n-type, which determines whether the current injection is a positive or negative current injection. The magnitude of injected current may be determined, for example, by operating voltage and series resistance. Injector topology may include parameters such as injector size, doping concentration, and depth of the injecting diffusion.

In some embodiments, the existence of parasitic SCR structures are determined based on a distance X between anode and cathode for SCR devices that trigger when distance X is less than the diffusion length of the minority carriers in the substrate, or if the holding voltage is higher than the supply voltage coupled to the terminals of parasitic structure. In embodiments, the distance X may be determined using one or more of the following parameters: well resistance, resistance in series with the anode and/or the cathode, distance of anode to n-well contact, distance of cathode to p-well contact, type of anode and/or cathode, doping concentration of layers forming the parasitic SCR, supply voltage, available guard rings in the design, common run length of anode and cathode diffusions. Well resistance may include the resistance of an n-well at the anode, or the resistance of the p-well at the cathode. The anode or cathode type includes the layers and structures of which the anode and cathode are fabricated. For example, the anode and/or cathode may be made of a combination of n+/p+/n-well/p-well/iso-p-well/triple-well/bulk, . . . etc. It should be appreciated that these parameters are non-exclusive examples that can be used to determine distance X. In alternative embodiments, other parameters may be used. In some embodiments layout checking systems and methods, worst case SCRs are identified and flagged according to the topology of injector, the distance Y between injector and parasitic SCR, distance X between the anode and cathode of parasitic SCR structure and the SCR type.

Figure 4:
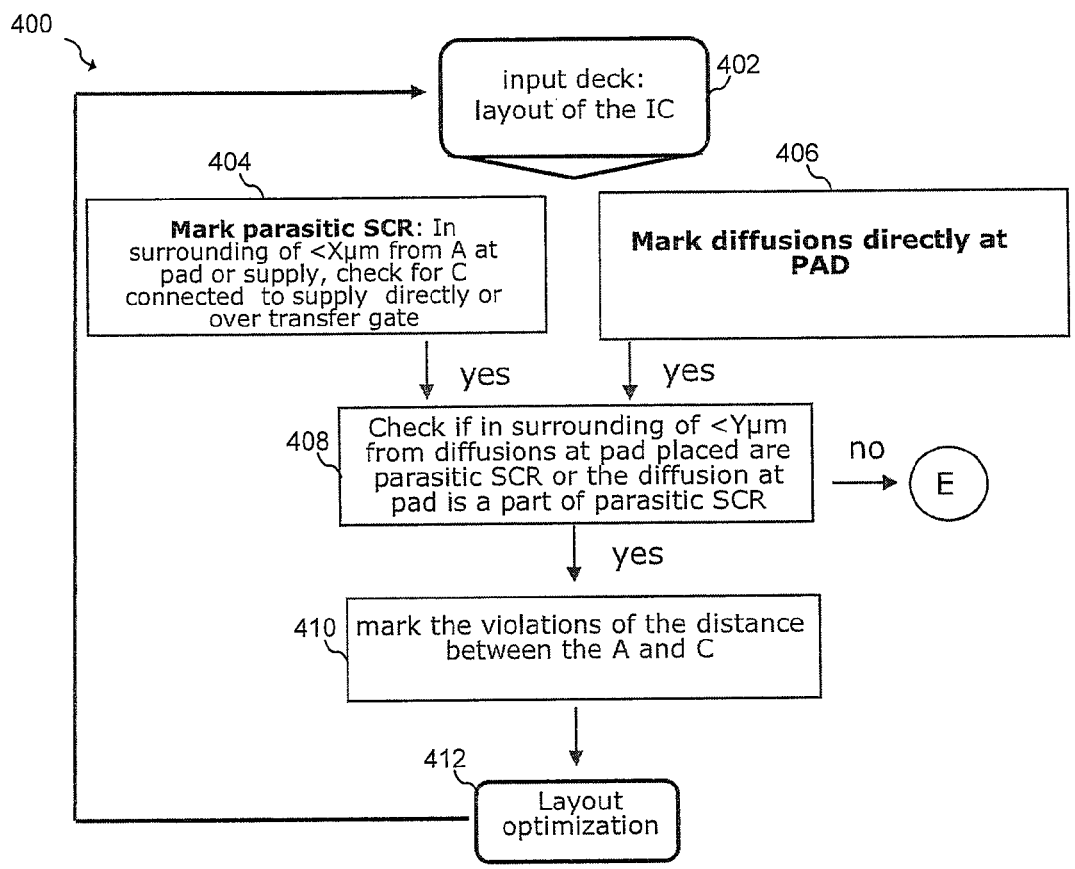
FIG. 4 illustrates a flowchart of an embodiment method.

FIG. 4 illustrates a flow chart of embodiment layout checking method 400. In some embodiments, a processor running software performs method 400. This software may contain programming code that implements embodiment algorithms that implements CAD analysis of the layout database for latch-up parasitic identification. In step 402, a layout database or input deck is accessed by the method. The layout database may in a format such as gds, oas, or any other format. The layout database may reside in a non-transitory computer readable medium such as a memory, hard-drive, non-volatile memory, or other storage device.

In step 404, parasitic SCR structures are identified. In one embodiment, cathodes within a distance of X μm of potential anodes are located, and the connectivity of the respective anodes and cathodes are analyzed. In step 406, potential hot diffusions are located and/or marked within the layout database. In some embodiments, these hot diffusions comprise diffusion regions that are connected to I/O pads. Furthermore, hot diffusions may also include diffusion areas that are coupled to any potential sources of bulk current. Steps 404 and 406 may be performed simultaneously in some embodiments. Alternatively, these steps may be performed sequentially.

Figures 5A, 5B, 6:
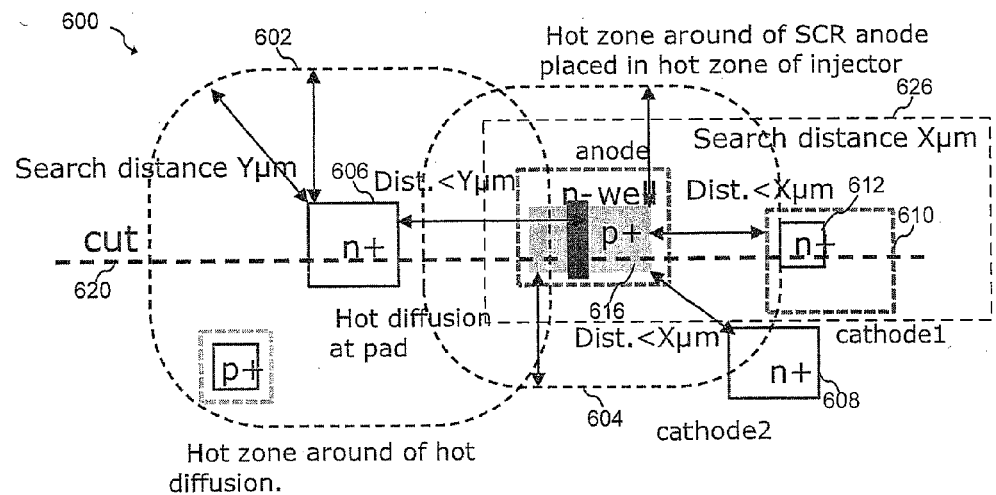
FIGS. 5a-b are tables of embodiment threshold distances according to parasitic device structure and connectivity.
FIG. 6 illustrates a layout of an SCR showing embodiment search zones.

Next, in step 408, the distance between identified hot diffusions and parasitic SCR structures are compared to distance Y. If the distance is less than Y, or if the identified hot diffusions is coincident with the identified parasitic SCR (e.g., the hot diffusion pad is also an identified anode and/or cathode) then violations are marked in step 410. In step 412, the layout is modified and/or optimized to address the flagged violations. This adjustment can be achieved using layout editor software such as those Cadence. In alternative embodiments, the order of the method steps may be altered. For example, potential hot diffusion pads may be located followed by a search for the anode and cathode within the distance Y of the hot diffusion pads. Once candidate anodes and cathodes are located within distance Y, distance X is determined and those SCR structures with the anode less than X from the cathode are marked. In further embodiments, separated check runs using various X and Y combinations may be started for each combination of different SCR types and bias conditions. Embodiment examples of different SCR types and bias conditions are shown in the tables of FIGS. 5a and 5b and are described further below.

Different distances X and Y may be extracted from measurements or simulations. Differentiation of X and Y distances allows for an area efficient design and parallel elimination of worst-case parasitic SCRs. In some embodiments, however, some voltage classes, detector types and/or injector types may be checked for the same X and Y distances, which simplifies the computer code and reduces the computation effort. In some embodiments, since the injector (hot-diffusion at PAD) may also become also a part of the parasitic SCR, one diffusion may be flagged in several checks (using different X and Y values) as a part of various parasitic SCRs built between various diffusions at different potentials. Furthermore, in some embodiments, if the distance X and Y is defined differently for different type of parasitic SCR structure, the basic methodology scheme illustrated in FIG. 4 is applied several times on the given input deck.

As discussed above, the different values for distances X and Y may be applied according to the source of injection and the type of the parasitic structure. The tables in FIGS. 5a and 5b present an example set of parameters for bulk CMOS. By differentiating distances X and Y according to various classes of the parasitic SCRs and injectors, extra design overhead may be avoided. FIG. 5a illustrates how distance Y varies according to hot diffusion type and according to connectivity of the n-well in which the anode is disposed. As can be seen by FIG. 5a, distance Y is significantly greater for SCR structures having a floating n-well. FIG. 5b illustrates how distance X varies according to anode voltage, cathode voltage, and anode connectivity. It should be appreciated that the examples shown in FIGS. 5a and 5b are specific examples for a particular embodiment bulk CMOS process. Other processes and other operating conditions may yield different values for X and Y. In further embodiments, other parameters may be used instead of, or in addition to the parameters listed in FIGS. 5a and 5b.

FIGS. 6-10 illustrates various layout and cross section views that illustrate how embodiment algorithms identify and extract parasitic SCRs. For illustrative purposes, the dashed lines in figures indicate the distance X and Y at which the algorithm or computer program checks for the presence of the parasitic SCRs in layout.

FIG. 6 illustrates an example of IC layout 600 with the graphical representation of an embodiment method. In an embodiment, the layout has n+ diffusion at PAD 606 and anode 616 of an identified parasitic thyristor 626 within a distance Y. The thyristor has anode 616, which is a part of a PMOS device, and two cathodes: n-well cathode 610 in which n+ region 612 is disposed, and n+ cathode 608 that reside within a distance X of anode 616. Dashed line 602 represents a perimeter of distance Y from n+ diffusion 606 and dashed line 604 represents a perimeter of X from anode 616. In an embodiment, cathodes 608 and 610 are biased at a lower potential than anode 616. Thus, two parasitic SCRs are built, one of p+/n-well/p-well/n+ structure and the other of a p+/n-well/p-well/n-well structure. It should be appreciated that the structures shown in FIG. 6 are few of many possible examples of SCR structures that are detectable using embodiment methods.

Figure 7:
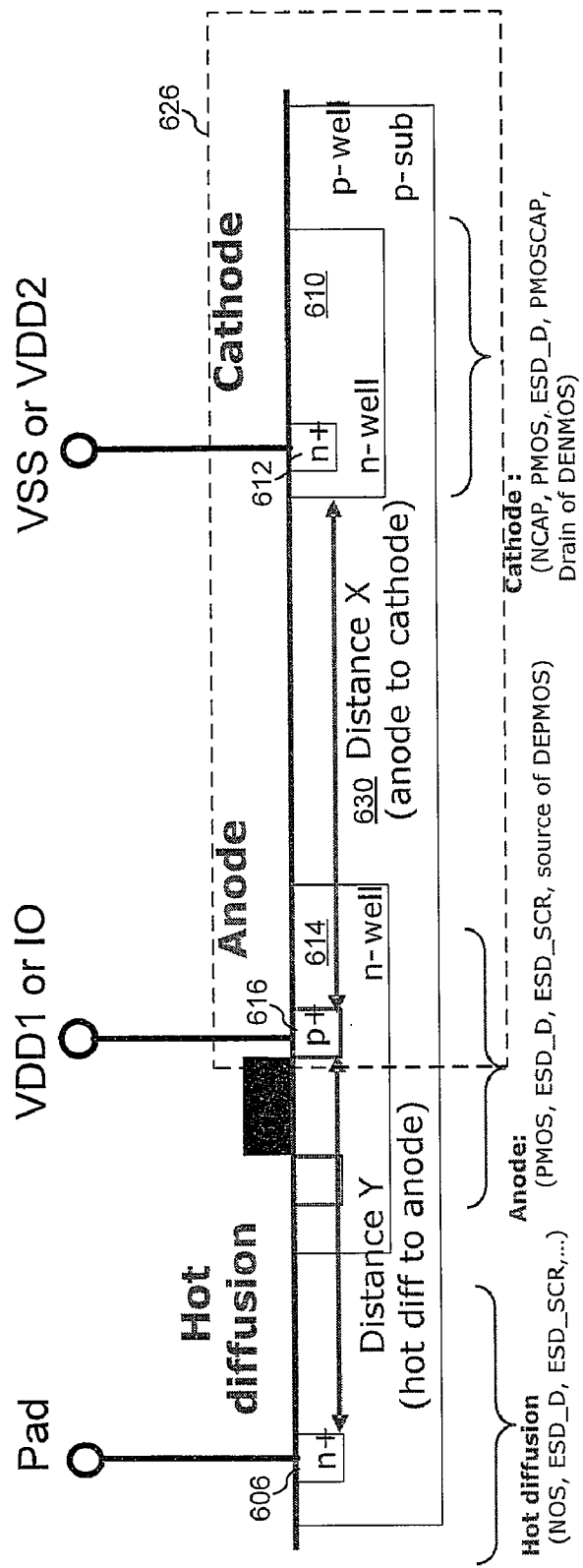
FIG. 7 illustrates a cross-section of a parasitic SCR detectable using embodiment methods.

The cross-section of the p+/n-well/p-well/n-well parasitic taken at dashed line 620 of FIG. 6 is illustrated in FIG. 7, which illustrates of injector 606 made of n+ diffusion at PAD and, and the p+/n-well/p-well/n-well parasitic SCR having p+ anode 616, n-well cathode 610, n-well n-type node 614 and p-well p-type node 630. As discussed above, p+ anode 616 is a part of a PMOS structure and n-well 610 on the cathode may be, for example, a part of a NCAP, diode or PMOS structure. In alternative embodiments, layers of the SCR may be a part of or coincident with other semiconductor structures depending on the particular integrated circuit and its particular process technology.

Figure 8:
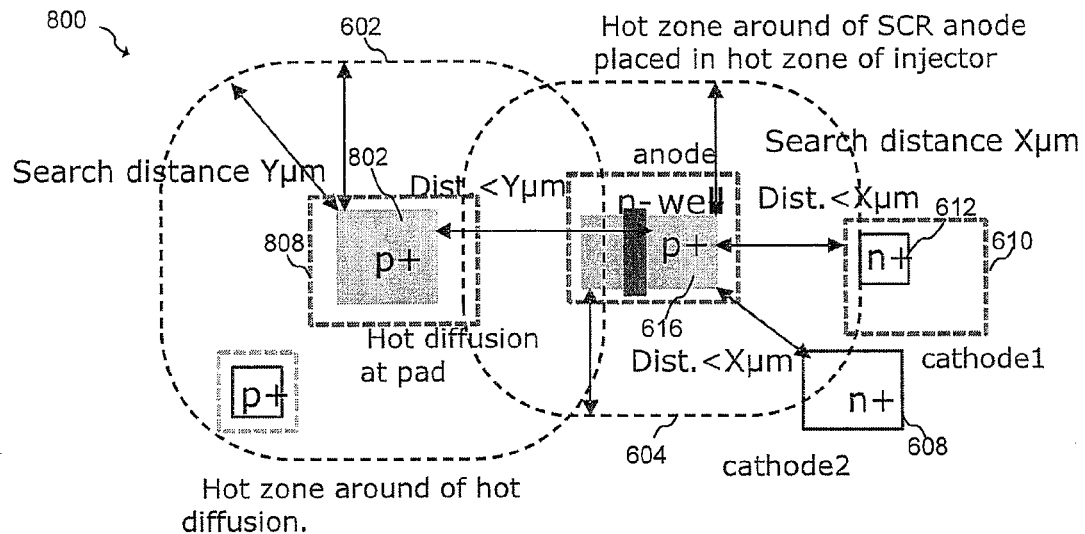
FIG. 8 illustrates a further layout of an SCR showing embodiment search zones.

FIG. 8 illustrates an example of IC layout 800 with a graphical representation of an embodiment method. In an embodiment, the layout has p+ diffusion at PAD 802 in n-well 808, and anode 616 of an identified parasitic thyristor 626 within a distance Y. Similar to the embodiment of FIG. 6, the thyristor has anode 616, which is a part of a PMOS device, and two cathodes: n-well cathode 610 and n+ cathode 608 that reside within a distance X of anode 616. Dashed line 602 represents a perimeter of distance Y from p+ diffusion 802 and dashed line 604 represents a perimeter of X from anode 616. In an embodiment, cathodes 608 and 610 are biased at a lower potential than anode 616. Thus, two parasitic SCRs are built, one of p+/n-well/p-well/n+ and the second of p+/n-well/p-well/n-well.

In some embodiment layout configurations that are commonly found in I/O areas, the latch-up injector itself may be involved in the parasitic SCR structure as an anode and/or a cathode. Therefore, in some embodiments, two diffusions are checked by the method in such cases. Here, when the same diffusion may be identified as both a hot-diffusion site and as an anode or a cathode of the parasitic SCR, the distance Y from injector to the anode or cathode is set to 0 µm because the respective anode or cathode constitutes an injector itself. Such an embodiment method may also flag the counterpart of the anode or cathode within a distance of X.

Figure 9:
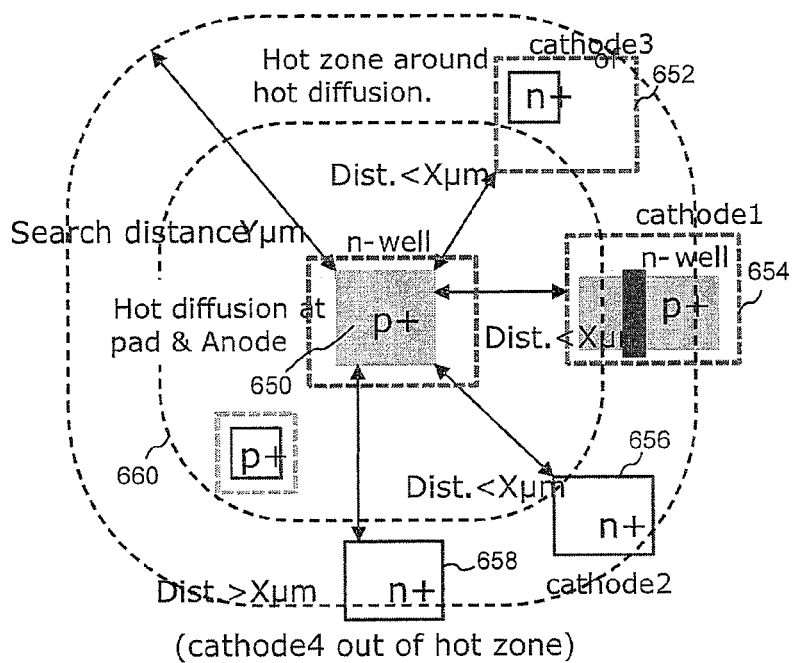
FIG. 9 illustrates a layout of an SCR showing embodiment search zones, in which the hot-diffusion is coincident with an anode of the SCR.

FIG. 9 illustrates an example where p+ diffusion 650 represents both an anode and a hot-diffusion site. Dashed line 660 represents a perimeter that is distance X from p+ diffusion 650. As can be seen in the Figure n-well cathodes 652 and 654 and n+ cathode 656 are within perimeter 660, and, therefore, are identified as being a part of the parasitic SCR. Cathodes 652, 654 and 656 are also biased as a lower potential than anode 650. N+ cathode region 658, however is outside of perimeter 660 and, therefore, is not considered a part of the parasitic SCR, and not flagged in some embodiments.

Figure 10:
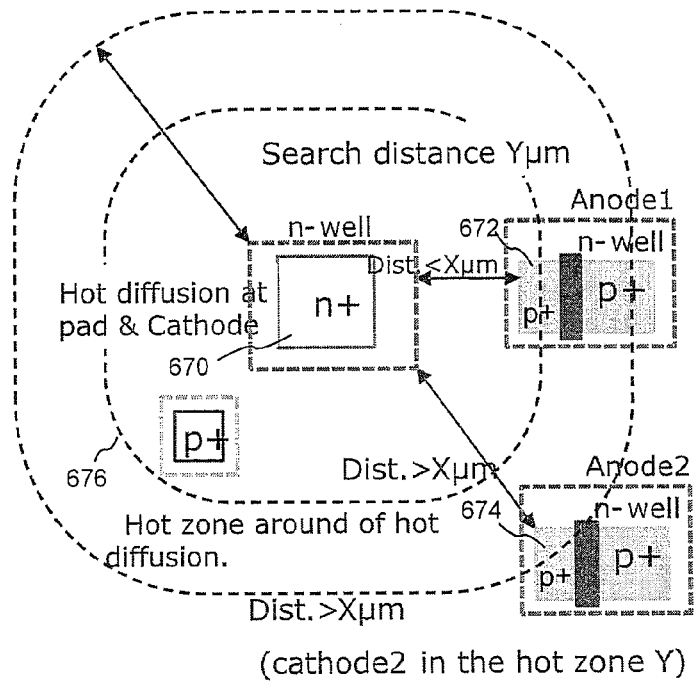
FIG. 10 illustrates a further layout of an SCR showing embodiment search zones, in which the hot-diffusion is coincident with a cathode of the SCR.

FIG. 10 illustrates an example where n+ diffusion 670 represents both a cathode and a hot-diffusion site. Dashed line 676 represents a perimeter that is distance X from n+ diffusion 670. As can be seen in the FIG. 10, p+ anode 672, which is a part of a PMOS device, is within perimeter 676, and is identified as being a part of the parasitic SCR. p+ anode 674, which is a part of a further PMOS device, is not within perimeter 676, is not considered a part of the parasitic SCR, and is not flagged by some embodiment methods. In some embodiments, anode 674 is not flagged because the holding voltage of its respective SCR is greater than the voltage difference between cathode 670 and anode 672. In an embodiment, cathode 670 is biased at a lower voltage than anode 672. In an embodiment, the SCR device will not be flagged if the cathode of the SCR device is at a higher potential than the identified anode of the SCR device.

Figure 11:
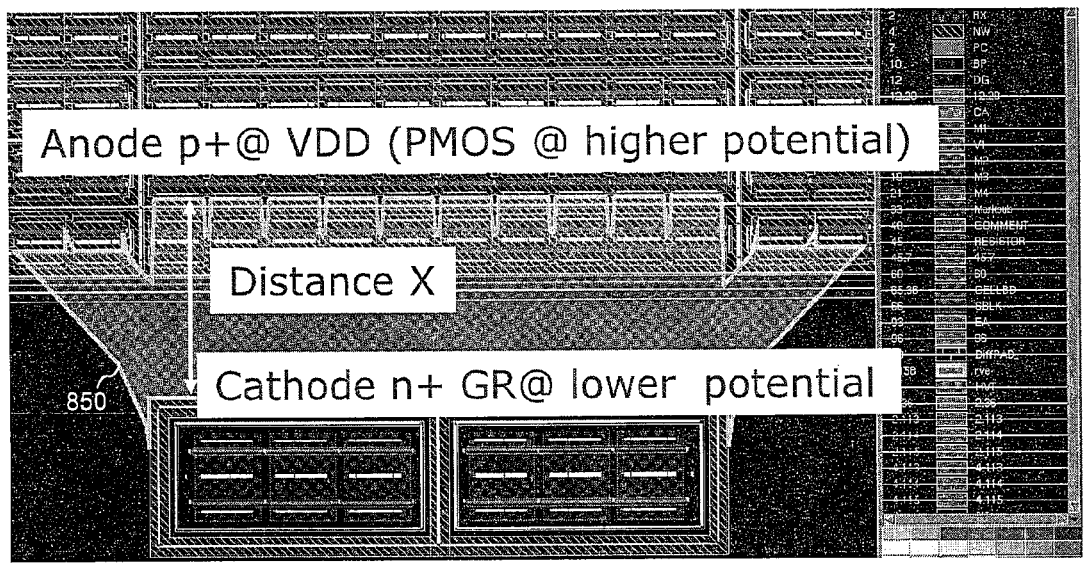
FIG. 11 illustrates an embodiment graphical display of an embodiment system.
Figure 12:
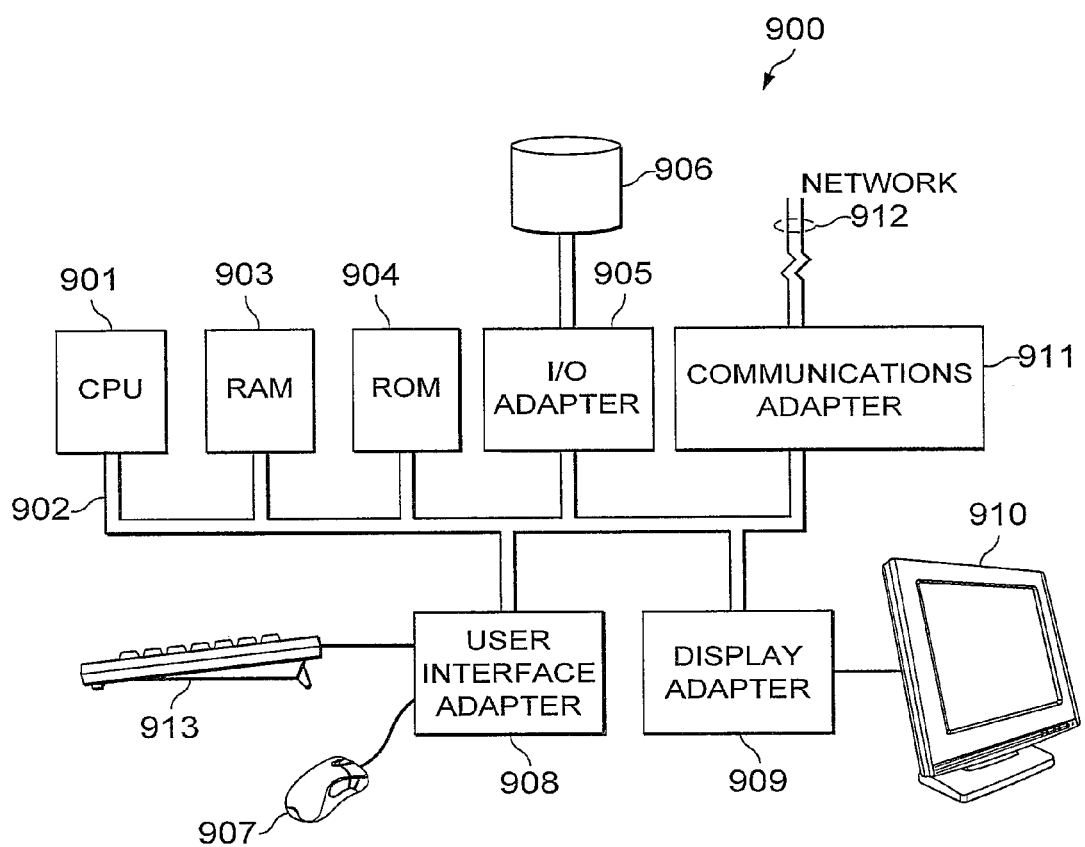
FIG. 12 illustrates a block diagram of a computer system that implements embodiment systems and methods.

FIG. 11, illustrates an exemplary graphical output display of an embodiment layout checking system. Here, area 850 between an anode comprising of many PMOS fingers at p+ source of a PMOS coupled to supply in a floating n-well and a cathode comprising an n-well guard ring attached to lower potential is shown flagged. In the illustrated embodiment, area 850 was flagged because the anode is less than X µm from the cathode and the resulting parasitic SCR resides in the hot zone range of less than Y µm from the hot-diffusion at PAD (not shown). It should be appreciated that the illustration of FIG. 12 is merely one illustrative example of an embodiment graphical user display, as identified parasitic SCRs may have different geometries. In further embodiments, several separated anodes and cathodes may be involved in the SCR and flagged in the check.

FIG. 12 illustrates computer system 900 adapted to use embodiments of the present invention, e.g., storing and/or executing software associated with the embodiments. Central processing unit (CPU) 901 is coupled to system bus 902. CPU 901 may be any general purpose CPU. However, embodiments of the present invention are not restricted by the architecture of CPU 901 as long as CPU 901 supports the inventive operations as described herein. Bus 902 is coupled to random access memory (RAM) 903, which may be SRAM, DRAM, or SDRAM. ROM 904 is also coupled to bus 902, which may be PROM, EPROM, or EEPROM. RAM 903 and ROM 904 hold user and system data and programs as is well known in the art.

Bus 902 is also coupled to input/output (I/O) adapter 905, communications adapter 911, user interface 908 coupled to keyboard 913 and mouse 907, and display card 909 coupled to display 910. In embodiments, display 910 is used to display graphical output of embodiment layout checking programs. In some embodiments, the computer system 900 is coupled to network 912 via communications adaptor 911. The I/O adapter 905 connects storage devices 906, such as one or more of a hard drive, a CD drive, a floppy disk drive, a tape drive, to computer system 900. The I/O adapter 905 is also connected to a printer (not shown), which would allow the system to print paper copies of information such as documents, photographs, articles, and the like. Note that the printer may be a printer, e.g., dot matrix, laser, and the like, a fax machine, scanner, or a copier machine.

In an embodiment, a method includes retrieving a layout of an integrated circuit design from a non-transitory computer readable medium, indentifying a silicon controlled rectifier (SCR) structure in the layout, indentifying a current injection site in the layout, determining if a distance between the identified current injection site and the indentified SCR structure and is less than a first threshold, and flagging a violation if the determined distance is less than the first threshold. In an embodiment, identifying the silicon controlled rectifier structure includes identifying a structure comprising an anode and a cathode, and determining if a distance between the anode and the cathode is less than a second threshold. If the distance is less then the second threshold, the structure is identified as the SCR structure. In some embodiments, the method also includes determining a SCR category of the identified SCR structure from a plurality of SCR categories, and adjusting the first threshold according to the determined SCR category. In one example, the identified SCR structure is determined to be in a first category if the anode is disposed in a floating n-well, and determined to be in a second category if the anode is disposed in an n-well that is configured to be coupled to a power supply node.

In some embodiments, adjusting the first threshold includes selecting a first value for the first threshold if the determined category is the first category, and selecting a second value for the first threshold if the determined category is the second category. In an embodiment, the second value is less than the first value.

In an embodiment, the method also includes indentifying nodes coupled to the identified structure, and adjusting the second threshold according to the identified nodes. Identifying nodes may include determining whether an n-well in which the anode is disposed is configured to be coupled to a power supply node, and adjusting the second threshold may include selecting a smaller second threshold value if the n-well is configured to be coupled to the power supply node. In some embodiments, identifying nodes may include determining a nominal potential difference between the anode and the cathode and adjusting the second threshold to be proportional to the nominal potential difference between the anode and the cathode.

In an embodiment, identifying the current injection site includes identifying a diffusion instance in the layout coupled to a pad. Adjusting the first threshold may include adjusting the first threshold according to a conductivity type of the identified diffusion instance, and adjusting comprising assigning a higher first threshold for an n-type diffusion instance than for a p-type diffusion instance. The p-type diffusion instance may include, for example, p-type bulk. In some embodiments, the current injection site is coincident with an anode or a cathode of the identified SCR structure.

In an embodiment, the distance between the identified current injection site and the indentified SCR structure is zero if the current injection site is coincident with an anode or a cathode of the identified SCR structure. In some embodiments, flagging the violation includes highlighting the violation on a visual display.

In an embodiment, a method of checking an integrated circuit layout database for parasitic thyristors includes retrieving an integrated circuit layout database a non-transitory computer readable medium and identifying hot pad diffusion sites. Identifying hot pad diffusion sites may include identifying diffusion sites in the layout databases that are coupled to pads. The method also includes identifying parasitic thyristor structures in the layout database, which may include identifying anode regions, cathode regions and well regions, determining that particular anode regions, cathode regions and well regions comprise an identified parasitic thyristor if a distance between an anode region and a cathode region is less than a second threshold, and flagging a violation if a distance between an identified parasitic thyristor and an identified hot pad diffusion site is less than a first threshold.

In an embodiment, the first threshold is dependent on at least one of: a semiconductor type of the hot pad diffusion site, an operating voltage of the hot pad diffusion site, a series resistance of the hot pad diffusion site, a topology of the hot pad diffusion site, and available guard-rings in the integrated circuit layout database. In some embodiments, the first threshold is dependent on whether or not an identified well region is a floating well region.

In an embodiment, a lower higher value is assigned to the first threshold if the identified well region is a floating well region, than if the identified well region is not a floating region. The second threshold may dependent on at least one of a resistance of the identified well regions, the types of layers forming the identified parasitic thyristor, doping concentrations of layers forming the identified parasitic thyristor, supply voltages, available guard rings between the anode regions and the cathode regions, a common run length of the anode regions and cathode regions, and the distance from the identified parasitic thyristor to the identified hot pad diffusion site.

In an embodiment, a non-transitory computer readable medium has an executable program stored thereon, and the program instructs a processor to perform the steps of identifying hot pad diffusion sites in a layout database and identifying parasitic thyristor structures in the layout database. Identifying hot pad diffusion sites may include identifying diffusion sites in the layout databases that are coupled to pads, and identifying parasitic thyristor structures may include identifying anode regions, cathode regions and well regions, and determining that particular anode regions, cathode regions and well regions comprise an identified parasitic thyristor if a distance between an anode region and a cathode region is less than a second threshold. The program further instructs the processor to flag a violation if a distance between an identified parasitic thyristor and an identified hot pad diffusion site is less than a first threshold.

In an embodiment, the processor is further instructed to perform a step of adjusting the first threshold based on topologies and connectivities of the identified parasitic thyristor and the identified hot pad diffusion sites.

Advantages of embodiments include the ability to design integrated circuits having improved latch-up performance, and the ability to extract the most critical parasitic SCR devices in a particular technology. Furthermore, by having different rules and threshold differences according to the type of parasitic structure and the type of hot-diffusion, the amount of false positives can be reduced, thereby achieving area optimized latch-up prevention. Here, flagged devices may be addressed by increasing distances between anodes and cathode without losing area to unnecessary margin in some embodiments.

Further advantages include flexibility in layout and application, as embodiment methods can be applied on an any available layout data format, and embodiment checking algorithms can be encoded in any programming language. A further advantage includes the fact that the checking algorithm can be applied to device geometries and no additional device properties, such as the betas of NPN and PNP devices, need to be added to the design system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   retrieving a layout of an integrated circuit design from a non-transitory computer readable medium;
   identifying a silicon controlled rectifier (SCR) structure in the layout by using a computer;
   identifying a current injection site in the layout, wherein the current injection site is different from the identified SCR structure;
   determining when a distance between the identified current injection site and the identified SCR structure and is less than a first threshold;
   wherein identifying the silicon controller rectifier structure comprises
   identifying a structure comprising an anode and a cathode, determining when a distance between the anode and the cathode is less than a second threshold, and
   when the distance is less than the second threshold, identifying the structure as the identified SCR structure; and
   flagging a violation if the determined distance is less than the first threshold.

2. The method of claim 1, further comprising;
   determining a SCR category of the identified SCR structure from a plurality of SCR categories; and
   adjusting the first threshold according to the determined SCR category.

3. The method of claim 2, wherein determining the category comprises:
   determining that the identified SCR structure is in a first category if the anode is disposed in a floating n-well; and
   determining that the identified SCR structure is in a second category if the anode is disposed in an n-well that is configured to be coupled to a power supply node.

4. The method of claim 3, wherein adjusting the first threshold comprises:
   selecting a first value for the first threshold if the determined category is the first category; and
   selecting a second value for the first threshold if the determined category is the second category, wherein the second value is less than the first value.

5. The method of claim 1, further comprising:
   identifying nodes coupled to the identified structure; and
   adjusting the second threshold according to the identified nodes.

6. The method of claim 5, wherein:
   identifying nodes comprises determining whether an n-well in which the anode is disposed is configured to be coupled to a power supply node; and
   adjusting the second threshold comprises selecting a smaller second threshold value if the n-well is configured to be coupled to the power supply node.

7. The method of claim 5, wherein identifying nodes comprises:
   determining a nominal potential difference between the anode and the cathode; and
   adjusting the second threshold to be proportional to the nominal potential difference between the anode and the cathode.

8. The method of claim 1, wherein identifying the current injection site identifying a diffusion instance in the layout coupled to a pad.

9. The method of claim 8, wherein adjusting the first threshold comprises adjusting the first threshold according to a conductivity type of the identified diffusion instance, adjusting comprising assigning a higher first threshold for an n-type diffusion instance than for a p-type diffusion instance.

10. The method of claim 9, wherein the p-type diffusion instance comprises p-type bulk.

11. The method of claim 1, wherein flagging the violation comprises highlighting the violation on a visual display.

12. A method of checking an integrated circuit layout database for parasitic thyristors, the method comprising:
    retrieving an integrated circuit layout database a non-transitory computer readable medium;
    identifying hot pad diffusion sites, identifying hot pad diffusion sites comprising identifying diffusion sites in the layout databases that are coupled to pads.
    identifying parasitic thyristor structures in the layout database by using a computer, identifying parasitic thyristor structures comprising:
       identifying anode regions, cathode regions and well regions,
       determining that particular anode regions, cathode regions and well regions comprise an identified parasitic thyristor if a distance between an anode region and a cathode region is less than a second threshold, wherein the parasitic thyristor structures are different from the identified hot pad diffusion sites; and
    flagging a violation when a distance between an identified parasitic thyristor and an identified hot pad diffusion site is less than a first threshold.

13. The method of claim 12, wherein the first threshold is dependent on at least one of:
    a semiconductor type of the hot pad diffusion site;
    an operating voltage of the hot pad diffusion site;
    a series resistance of the hot pad diffusion site;
    a topology of the hot pad diffusion site; and
    available guard-rings in the integrated circuit layout database.

14. The method of claim 12, wherein the first threshold is dependent on whether or not an identified well region is a floating well region.

15. The method of claim 14, wherein a higher value is assigned to the first threshold if the identified well region is a floating well region, than if the identified well region is not a floating region.

16. The method of claim 12, wherein the second threshold is dependent on at least one of:
    a resistance of the identified well regions;
    types of layers forming the identified parasitic thyristor;
    doping concentrations of layers forming the identified parasitic thyristor;
    supply voltages;
    available guard rings between the anode regions and the cathode regions;
    a common run length of the anode regions and cathode regions; and
    distance from the identified parasitic thyristor to the identified hot pad diffusion site.

17. A non-transitory computer readable medium with an executable program stored thereon, wherein the program instructs a processor to perform the following steps:
    identifying hot pad diffusion sites in a layout database, identifying hot pad diffusion sites comprising identifying diffusion sites in the layout databases that are coupled to pads.

identifying parasitic thyristor structures in the layout database, identifying parasitic thyristor structures comprising:
  identifying anode regions, cathode regions and well regions,
  determining that particular anode regions, cathode regions and well regions comprise an identified parasitic thyristor if a distance between an anode region and a cathode region is less than a second threshold, wherein the parasitic thyristor structures are different from the identified hot pad diffusion sites; and
flagging a violation when a distance between an identified parasitic thyristor and an identified hot pad diffusion site is less than a first threshold.

18. The non-transitory computer readable medium of claim 17, wherein the processor is further instructed to perform the step of adjusting the first threshold based on topologies and connectivities of the identified parasitic thyristor and the identified hot pad diffusion sites.

19. A method comprising:
retrieving a layout of an integrated circuit design from a non-transitory computer readable medium;
identifying a silicon controlled rectifier (SCR) structure in the layout by using a computer;
identifying a current injection site in the layout;
determining if a distance between the identified current injection site and the identified SCR structure and is less than a first threshold, wherein the distance between the identified current injection site and the identified SCR structure is zero when the current injection site is coincident with an anode or a cathode of the identified SCR structure;
wherein identifying the silicon controller rectifier structure comprises:
identifying a structure comprising an anode and a cathode;
determining when a distance between the anode and the cathode is less than a second threshold; and
when the distance is less than the second threshold, identifying the structure as the identified SCR structure; and
flagging a violation if the determined distance is less than the first threshold.

20. A method comprising:
retrieving a layout of an integrated circuit design from a non-transitory computer readable medium; and
identifying a silicon controlled rectifier (SCR) structure in the layout by using a computer,
identifying a current injection site in the layout, wherein the current injection site is different from the identified SCR structure, identifying the SCR structure comprising
  identifying a structure comprising an anode and a cathode,
  determining a nominal potential difference between the anode and the cathode,
  adjusting a threshold to be proportional to the nominal potential difference between the anode and the cathode,
  determining when a distance between the anode and the cathode is less than the threshold, and
  when the distance is less than the threshold, identifying the structure as the identified SCR structure.

21. A method comprising:
retrieving a layout of an integrated circuit design from a non-transitory computer readable medium;
identifying a silicon controlled rectifier (SCR) structure in the layout by using a computer, wherein identifying the silicon controlled rectifier structure comprises:
  identifying a structure comprising an anode and a cathode,
  determining when a distance between the anode and the cathode is less than a second threshold, and
  when the distance is less than the second threshold, identifying the structure as the identified SCR structure;
determining a SCR category of the identified SCR structure from a plurality of SCR categories, wherein determining the category comprises:
  determining that the identified SCR structure is in a first category when the anode is disposed in a floating n-well, and
  determining that the identified SCR structure is in a second category when the anode is disposed in an n-well that is configured to be coupled to a power supply node;
adjusting the first threshold according to the determined SCR category;
identifying a current injection site in the layout;
determining when a distance between the identified current injection site and the identified SCR structure and is less than a first threshold; and
flagging a violation when the determined distance is less than the first threshold.

22. The method of claim 21,
wherein adjusting the first threshold comprises:
selecting a first value for the first threshold when the determined category is the first category; and
selecting a second value for the first threshold when the determined category is the second category, wherein the second value is less than the first value.

* * * * *